United States Patent
Liou et al.

(10) Patent No.: US 9,748,139 B1
(45) Date of Patent: Aug. 29, 2017

(54) METHOD OF FABRICATING DUAL DAMASCENE STRUCTURE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/016,230

(22) Filed: Feb. 4, 2016

(51) Int. Cl.
*H01L 21/768* (2006.01)

(52) U.S. Cl.
CPC .... *H01L 21/76897* (2013.01); *H01L 21/7681* (2013.01); *H01L 21/76813* (2013.01); *H01L 2221/1021* (2013.01)

(58) Field of Classification Search
CPC .......... H01L 21/76897; H01L 21/7681; H01L 21/76813
USPC .......................................................... 438/624
See application file for complete search history.

(56) References Cited

U.S. PATENT DOCUMENTS

| | | | |
|---|---|---|---|
| 6,413,815 B1 * | 7/2002 | Lai | H01L 21/76808 257/E21.011 |
| 8,735,295 B2 | 5/2014 | Lee | |
| 2012/0074536 A1 * | 3/2012 | Beck | H01L 21/76832 257/635 |
| 2012/0149204 A1 | 6/2012 | Hsieh | |
| 2013/0178041 A1 * | 7/2013 | Booth | H01L 21/31116 438/382 |
| 2013/0183825 A1 * | 7/2013 | Liou | H01L 21/76813 438/675 |
| 2013/0337650 A1 * | 12/2013 | Lee | H01L 21/302 438/702 |
| 2015/0072519 A1 * | 3/2015 | Lu | H01L 21/76829 438/626 |

* cited by examiner

*Primary Examiner* — Moazzam Hossain
*Assistant Examiner* — Omar Mojaddedi
(74) *Attorney, Agent, or Firm* — Winston Hsu

(57) ABSTRACT

A substrate having thereon a first dielectric layer, a second dielectric layer, and a hard mask layer is provided. A partial via is formed in the second dielectric layer and the hard mask layer. A first photoresist pattern with a first trench opening above the partial via and a second trench opening is formed on the hard mask layer. The hard mask layer and the second dielectric layer are etched through the first trench opening and the second trench opening, thereby forming a first dual damascene structure comprising a first trench and a first via, and a second trench in the second dielectric layer, respectively. A second photoresist pattern having a self-aligned via opening above the second trench is formed. The second dielectric layer is etched through the self-aligned via opening, thereby forming a second dual damascene structure comprising the second trench and a second via under the second trench.

8 Claims, 6 Drawing Sheets

METHOD OF FABRICATING DUAL DAMASCENE STRUCTURE

BACKGROUND OF THE INVENTION

1. Field of the Invention

The present invention relates generally to a method for manufacturing a semiconductor structure, more particularly, to a method for manufacturing a dual damascene structure adopting double patterning technique (DPT).

2. Description of the Prior Art

In the fabrication of semiconductor integrated circuits (ICs), semiconductor devices are generally connected by several metal interconnecting layers commonly referred to as multi-level interconnects, and damascene process has been deemed a convenient and predominant method for forming the multi-level interconnects. Principally, the damascene process includes etching a dielectric material layer to form trench and/or via patterns, filling the patterns with conductive materials such as copper, and performing a planarization process.

Photolithography is an essential process in the fabrication of semiconductor ICs. Principally, the photolithography is to form designed patterns such as implantation patterns or layout patterns on at least a photomask, and then to precisely transfer such patterns to a photoresist layer by exposure and development processes. Subsequently, by performing processes such as ion implantation, etching process, or deposition, the complicated and sophisticated IC structure is obtained.

Along with miniaturization of semiconductor devices and progress in fabrication of semiconductor device, conventional lithography process meets the bottleneck due to printability and manufacturability. To meet the requirements of device design rules which continue to push the resolution limits of existing processes and tooling, double patterning technique (DPT) is developed and taken as one of the most promising lithography technologies for 22 nm or 14 nm node patterning since it can increase the half-pitch resolution by up to two times using current infrastructures. However, the prior art DPT is confronted with a problem of via open induced by hard mask over confined as overlay misalignment.

SUMMARY OF THE INVENTION

It is one object of the invention to provide an improved method for manufacturing a dual damascene structure, which involves the use of double patterning technique (DPT), in order to solve the shortcomings of the prior art.

According to one aspect of the present invention, a manufacturing method for a dual damascene structure is provided. A substrate having thereon a first dielectric layer, a second dielectric layer, and a hard mask layer is provided. A partial via is then formed in the second dielectric layer and the hard mask layer. A first photoresist pattern is formed on the hard mask layer. The first photoresist pattern comprises a first trench opening above and overlapping with the partial via. The first photoresist pattern also comprises a second trench opening adjacent to the first trench. A first etching process is then performed to etch the hard mask layer and the second dielectric layer through the first trench opening and the second trench opening, thereby forming a first dual damascene structure comprising a first trench and a first via, and a second trench in the second dielectric layer, respectively. Thereafter, a second photoresist pattern is formed on the hard mask layer. The second photoresist pattern comprises a self-aligned via opening above the second trench. A second etching process is then performed to etch the second dielectric layer through the self-aligned via opening, thereby forming a second dual damascene structure comprising the second trench and a second via under the second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 1-5 are schematic drawings illustrating a method for manufacturing a dual damascene structure according to one embodiment of the invention, wherein

DETAILED DESCRIPTION

Figure 1A:
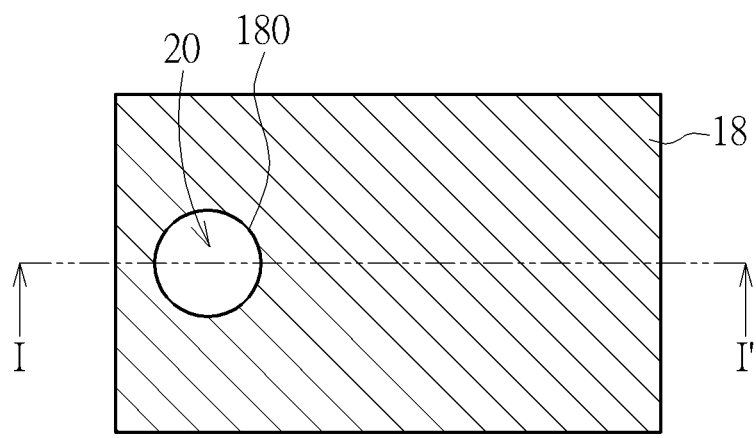
FIGS. 1A, 2A, 3A, 4A and 5A are schematic layout diagrams of a semiconductor structure in different manufacturing stages according to an exemplary embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The terms substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of a semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 3A:
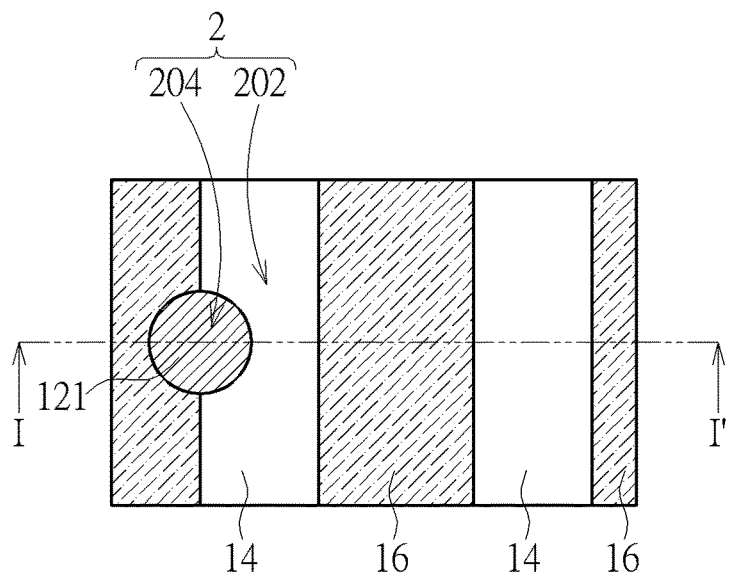
Figure 3B:
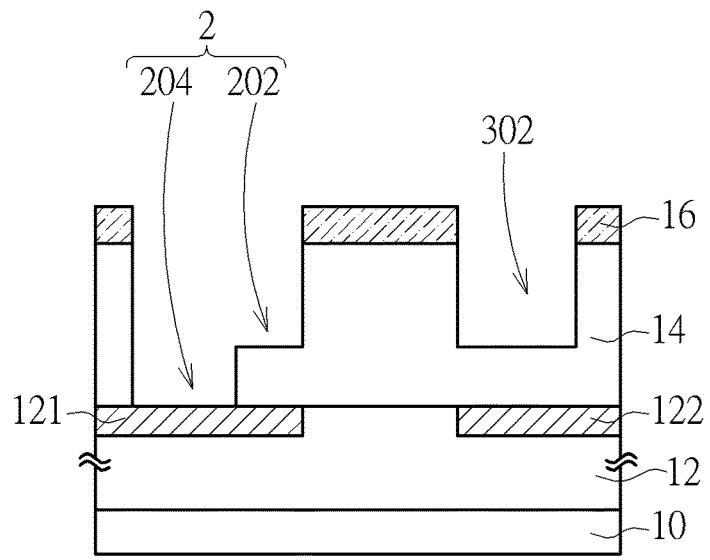
Figure 4A:
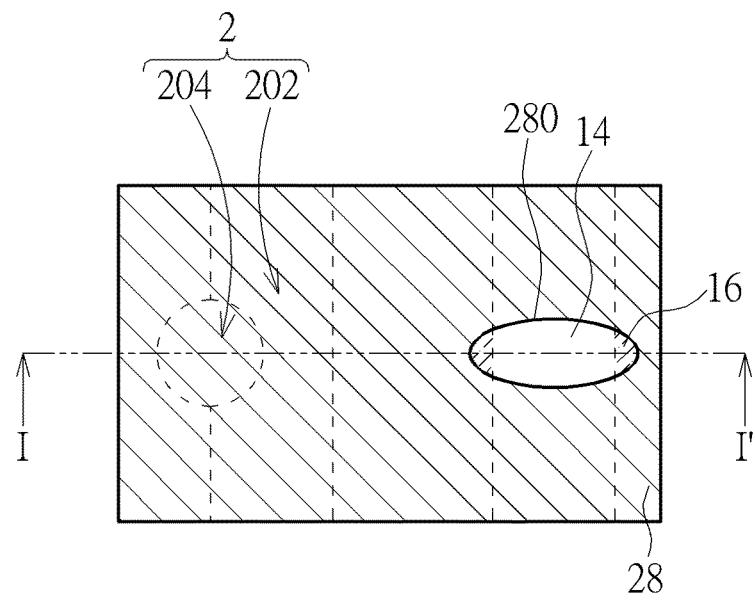
Figure 4B:
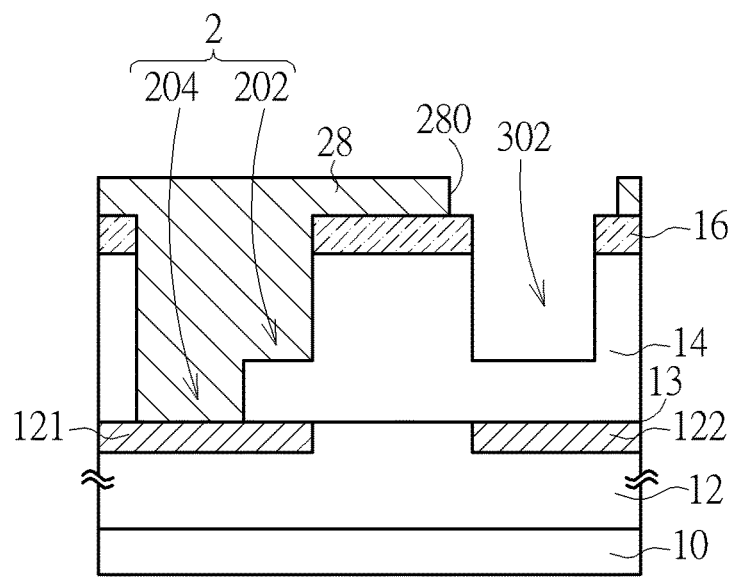
Figure 5A:
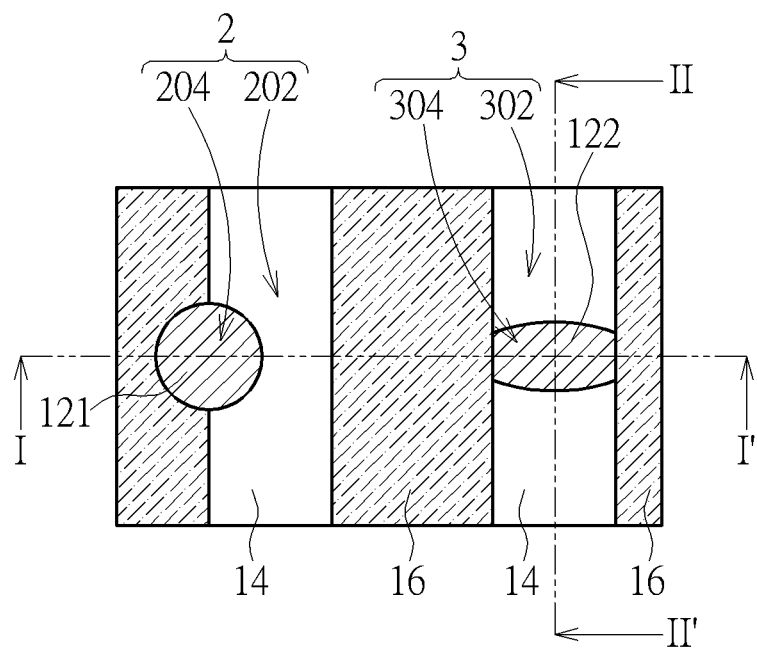

Please refer to FIGS. 1-5, which are schematic drawings illustrating a method for manufacturing a dual damascene structure according to one embodiment of the invention, wherein FIGS. 1A, 2A, 3A, 4A and 5A are schematic layout diagrams of a semiconductor structure in different manufacturing stages according to an exemplary embodiment of the invention, FIGS. 1B, 2B, 3B, 4B and 5B are cross-sectional views respectively taken along line I-I' of FIGS. 1A, 2A, 3A, 4A and 5A, and FIG. 5C is a cross-sectional view taken along line II-II' of FIG. 5A.

Figure 1B:
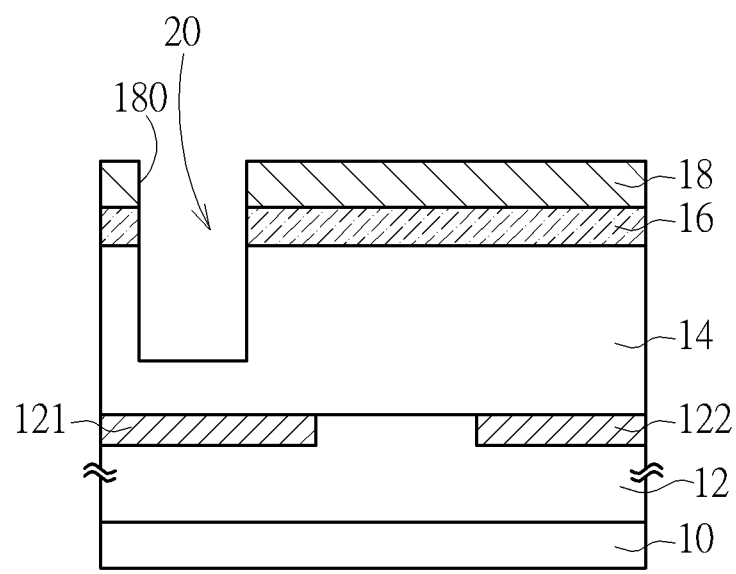
FIGS. 1B, 2B, 3B, 4B and 5B are cross-sectional views respectively taken along line I-I' of FIGS. 1A, 2A, 3A, 4A and 5A.

As shown in FIG. 1A and FIG. 1B, a substrate 10 is provided. The substrate 10 may comprise a silicon substrate or any semiconductor substrate, but is not limited thereto. A first dielectric layer 12 is provided on the substrate 10. For example, the first dielectric layer 12 may comprise low dielectric constant (low-k) material (k value smaller than 3.9), ultra-low-k (ULK) material (k value smaller than 2.6), or porous ULK material, but is not limited thereto. A first conductive layer 121 and a second conductive layer 122 are provided in the first dielectric layer 12. The first conductive layer 121 and the second conductive layer 122 are in the same horizontal level and may be formed in the same metal layer.

The first and second conductive layers 121 and 122 may comprise any kind of conductive elements, including, but not limited to, gate electrodes, source electrodes, contact plugs, via plugs, conductive lines etc., or metal contacts. An etch stop layer 13 may be formed on the first and second conductive layers 121 and 122, and on the first dielectric layer 12. The etch stop layer 13 may comprise a nitrogen-doped silicon carbide (NDC) layer, but is not limited thereto.

Subsequently, a second dielectric layer 14 and a hard mask layer 16 are sequentially deposited over the first dielectric layer 12. For example, the second dielectric layer 14 may comprise low dielectric constant (low-k) material (k value smaller than 3.9), ultra-low-k (ULK) material (k value smaller than 2.6), or porous ULK material, but is not limited thereto. According to the embodiment, the hard mask layer 16 may comprise Ti or TiN, but is not limited thereto. According to the process conditions and the manufacturing methods, the hard mask layer 16 may comprise a single layered structure or a multi-layered structure made of at least two materials.

A photoresist layer 18 is then formed on the hard mask layer 16. The photoresist layer 18 may be a dual-layer structure or a tri-layer structure, but is not limited thereto. For example, the aforesaid dual-layer structure or tri-layer structure may comprise an anti-reflective layer, or an organic dielectric layer, but is not limited thereto. An opening 180 is formed in the photoresist layer 18 to define the location and shape of a first via to be transferred to the underlying layers. The formation of the opening 180 in the photoresist layer 18 is known in the art.

For example, well-established photolithographic processes including, but not limited to, exposure and development, may be performed to form the opening 180 with a pre-determined feature size. Subsequently, an etching process such as a dry etching process is carried out to etch through the hard mask layer 16 and partially etch the second dielectric layer 14. The etching process stops at a predetermined depth in the second dielectric layer 14 to thereby form a partial via 20 in the second dielectric layer 14 and the hard mask layer 16.

Figure 2A:
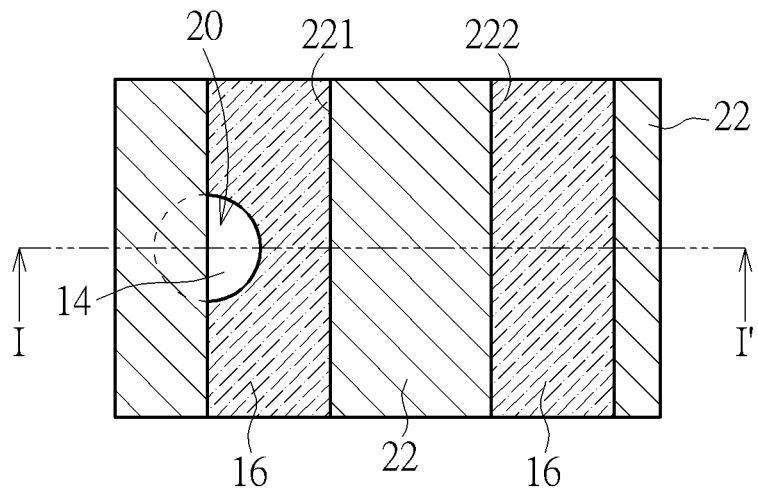
Figure 2B:
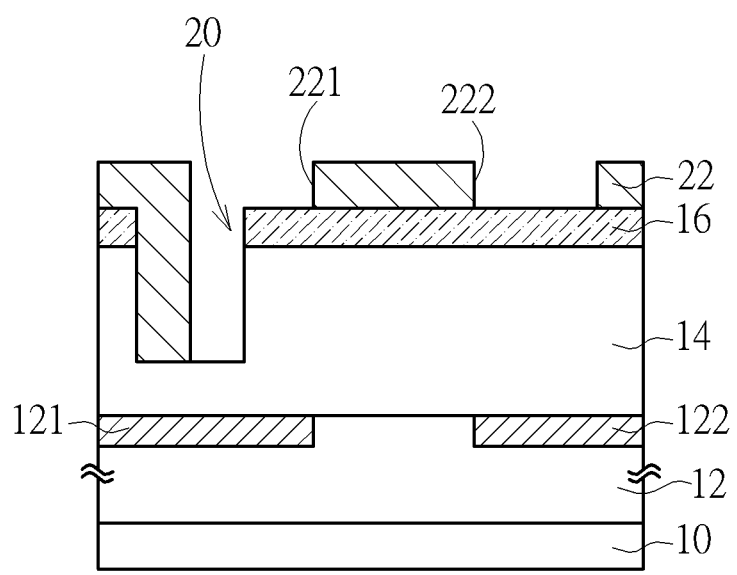

As shown in FIG. 2A and FIG. 2B, a photoresist pattern 22 is formed on the hard mask layer 16. The photoresist pattern 22 may comprise at least a first trench opening 221 directly above the partial via 20, and a second trench opening 222 that is located adjacent to the first trench opening 221. According to the embodiment, the first trench opening 221 may partially overlap with the partial via 20. The patterns of the first trench opening 221 and the second trench opening 222 are then transferred to the underlying hard mask layer 16 by using an etching process such as a dry etching process. If the distance between two patterns being too small for a common process, the patterns of the first trench opening 221 and the second trench opening 222 may be split or decomposed into two sets of patterns, each of which is printed using a separate mask in a separate exposure step.

Subsequently, as shown in FIG. 3A and FIG. 3B, the photoresist pattern 22 may be removed. Subsequently, using the hard mask layer 16 comprising the patterns of the first trench opening 221 and the second trench opening 222, another dry etching process is carried out to form a first dual damascene structure 2 comprising a first trench 202 and a first via 204, and a second trench 302 in the second dielectric layer 14, respectively. The first via 204 of the first dual damascene structure 2 exposes a portion of the first conductive layer 121.

As shown in FIG. 4A and FIG. 4B, after the formation of the first dual damascene structure 2 and the second trench 302 in the second dielectric layer 14, a photoresist pattern 28 is then formed on the hard mask layer 16. The photoresist pattern 28 comprises a self-aligned via opening 280 above the second trench 302. As can be best seen in FIG. 4A, the self-aligned via opening 280 may have a width that is slightly wider than the width of the second trench 302. The photoresist pattern 28 completely fills up the first trench 202 and the first via 204 of the first dual damascene structure 2. The photoresist pattern 28 may be a dual-layer structure or a tri-layer structure, but is not limited thereto. For example, the aforesaid dual-layer structure or tri-layer structure may comprise an organic dielectric layer, but is not limited thereto.

Figure 5B:
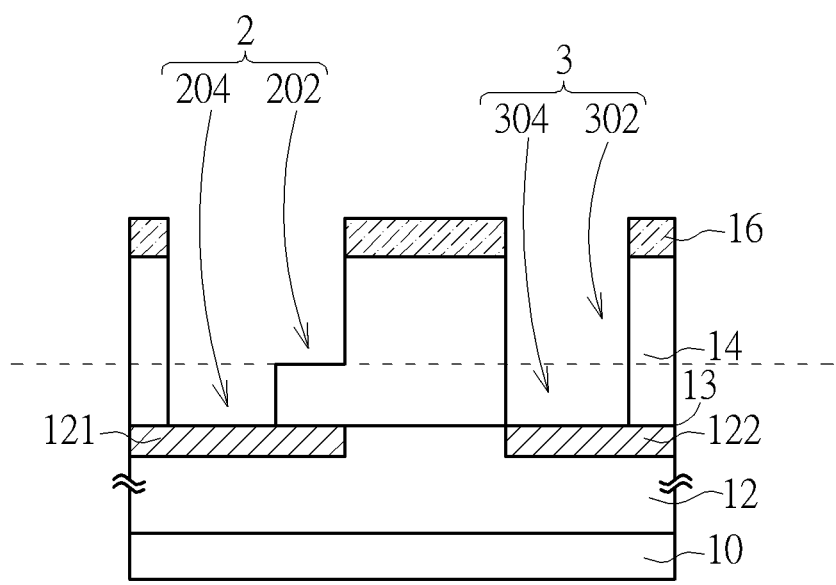
Figure 5C:
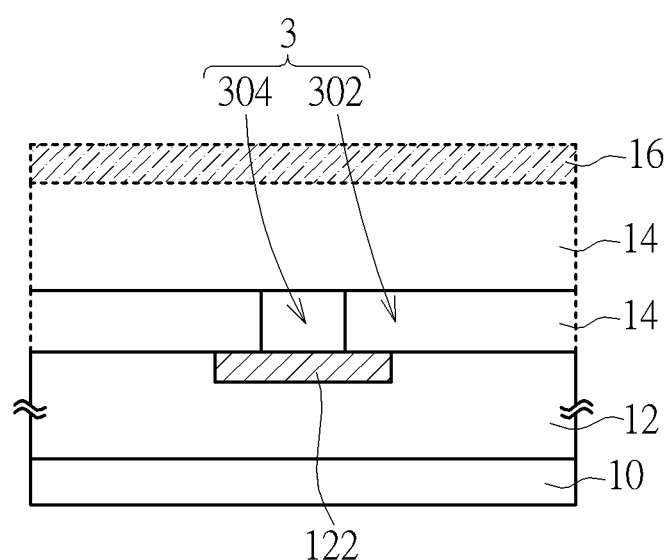
FIG. 5C is a cross-sectional view taken along line II-II' of FIG. 5A.

As shown in FIGS. 5A, 5B, and 5C, an etching process such as a dry etching process is performed to etch the second dielectric layer 14 through the self-aligned via opening 280, thereby forming a second dual damascene structure 3 comprising the second trench 302 and a second via 304 under the second trench 302. The second via 304 exposes a portion of the second conductive layer 122. According to the embodiment, the second via 304 is a self-aligned via (SAV) because the second via 304 is self-aligned with an edge of the hard mask layer 18.

The present invention provides a method of forming a first dual damascene structure having a partial via by using a via-first approach, wherein the location of partial via is precisely defined by a lithography process. Thereafter, a second dual damascene structure having a self-aligned via is performed by using a trench-first approach, wherein the location of self-aligned via is confined by hard mask. Thus, the present invention integrates these two different approaches in a more efficient way to avoid the issue of partial via open induced by hard mask over confined as overlay misalignment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a dual damascene structure, comprising:
   providing a substrate having thereon a first dielectric layer, a second dielectric layer, and a hard mask layer;
   forming a partial via in the second dielectric layer and the hard mask layer;
   forming a first photoresist pattern on the hard mask layer, wherein the first photoresist pattern comprises a first trench opening above the partial via and a second trench opening;
   performing a first etching process to etch the hard mask layer and the second dielectric layer through the first trench opening and the second trench opening, thereby forming a first dual damascene structure comprising a first trench and a first via, and a second trench in the second dielectric layer, respectively;
   forming a second photoresist pattern on the hard mask layer, wherein the second photoresist pattern comprises a self-aligned via opening having a width larger than a width of the second trench and exposing a part of the second trench and a part of the hard mask adjacent to the second trench; and
   performing a second etching process using the second photoresist pattern and the exposed hard mask as an etching mask to etch the second dielectric layer through the self-aligned via opening, thereby forming a second dual damascene structure comprising the second trench and a second via under the second trench, wherein a width of the second via equals to the width of the second trench.

2. The method according to claim 1, wherein the second photoresist pattern completely fills up the first trench and the first via of the first dual damascene structure.

3. The method according to claim 1, wherein the second via is self-aligned with an edge of the hard mask layer.

4. The method according to claim 1, wherein a first conductive layer and a second conductive layer are provided in the first dielectric layer.

5. The method according to claim 4, wherein the first conductive layer and the second conductive layer are in the same horizontal level.

6. The method according to claim 5, wherein the first via of the first dual damascene structure exposes a portion of the first conductive layer.

7. The method according to claim 5, wherein the second via of the second dual damascene structure exposes a portion of the second conductive layer.

8. The method according to claim 1, wherein an etch stop layer is provided between the first dielectric layer and the second dielectric layer.

* * * * *